United States Patent [19]

Wu et al.

[11] Patent Number: 5,387,829
[45] Date of Patent: Feb. 7, 1995

[54] OUTPUT SIGNAL PROCESSING CIRCUIT FOR A CHARGE-COUPLED DEVICE

[75] Inventors: Liang-Chung Wu; Chern-Chian Cheng, both of Hsin-Chu, Taiwan, Prov. of China

[73] Assignee: Hualon Microelectronics Corporation, Hsin-Chu, Taiwan, Prov. of China

[21] Appl. No.: 171,276

[22] Filed: Dec. 21, 1993

[51] Int. Cl.[6] .......................... H03K 5/22; H03F 3/45
[52] U.S. Cl. .............................. 327/65; 327/67; 327/72; 327/73
[58] Field of Search ............... 307/354, 355, 356, 358, 307/359, 494, 497, 542, 546, 564, 572; 328/163, 165

[56] References Cited

U.S. PATENT DOCUMENTS

| | | | |
|---|---|---|---|
| 4,454,435 | 6/1984 | Burns | 307/542 |
| 5,047,667 | 9/1991 | Howie | 307/358 |
| 5,057,716 | 10/1991 | Kiing | 307/494 |
| 5,182,477 | 1/1993 | Yamasaki et al. | 307/494 |

*Primary Examiner*—Timothy P. Callahan
*Assistant Examiner*—T. T. Lam
*Attorney, Agent, or Firm*—Wolf, Greenfield & Sacks

[57] ABSTRACT

A signal processing circuit is to be connected to an output stage of a charge-coupled device which includes a reference signal circuit and a CCD signal circuit that generate first and second output signals, respectively. The signal processing circuit includes a differential circuit and first and second amplifiers. The differential circuit receives the first and second output signals from the output stage of the charge-coupled device and generates a first signal corresponding to the first output signal and a second signal corresponding to the second output signal. The first amplifier has an output, a first input which receives the first signal from the differential circuit, and a second input which is connected to the output to serve as a negative feedback input thereto. The second amplifier has an output, a first input which receives the second signal from the differential circuit, and a second input which is connected to the output of the first amplifier to serve as a negative feedback input thereto. The second amplifier amplifies portions of the second signal which differ from the first signal to minimize the effect of noise.

3 Claims, 4 Drawing Sheets

OUTPUT SIGNAL PROCESSING CIRCUIT FOR A CHARGE-COUPLED DEVICE

BACKGROUND OF THE INVENTION

1. Field of the Invention

The invention relates to a signal processing circuit for a charge-coupled device, more particularly to a signal processing circuit which is capable of minimizing the presence of noise at the outputs of the charge-coupled device.

2. Description of the Related Art

Referring to FIG. 1, the output stage of a conventional charge-coupled device (CCD) is shown to comprise a reference signal circuit 1 and a CCD signal circuit 2. The reference signal circuit 1 includes an output control gate 11, a floating diode sense capacitor 12, a reset gate 13, and a reset drain 14. The CCD signal circuit 2 includes a CCD register 21, an output control gate 22, a floating diode sense capacitor 23, a reset gate 24, and a reset drain 25. The reference signal circuit 1 generates an output signal (VIC) which is obtained from the sense capacitor 12 and which serves as a reference voltage level. The CCD signal circuit 2 generates an output signal (VIO) which is taken from the sense capacitor 23 and which contains scanned data signals.

FIG. 2 illustrates a conventional signal processing circuit 3 for the output stage of the conventional charge-coupled device. The signal processing circuit 3 comprises a differential circuit 31, an amplifier 32 and an output buffer 33. The differential circuit 31 receives the outputs signals (VIC, VIO) from the reference signal circuit 1 and the CCD signal circuit 2. The output of the differential circuit 31 is amplified by the amplifier 32 before being provided to the output buffer 33.

FIG. 5A illustrates a sample output signal (Vo) which can be obtained from the signal processing circuit 3. The sample output signal (Vo) is divided into four signal output periods (M0–M3). Each output period is further divided into three sub-periods (tn, to, ts). A reset noise is present during the sub-period (tn) and is induced at the sense capacitors 12, 23 by the clock input ($\phi$R) to the reset gates 13, 24 of the reference signal circuit 1 and the CCD signal circuit 2. The differential circuit 31 of the signal processing circuit 3 serves to minimize the effect of the reset noise during the sub-period (tn). The presence of the sub-period (to) permits isolation of the reset noise from the data signal present during the sub-period (ts).

In the sample output signal (Vo) shown in FIG. 5A, noise signals (−N1) and (+N2) can occur during the sub-periods (to, ts) of the periods (M1, M2), thereby affecting the precision of the charge-coupled device. Similarly, the occurrence of a noise signal (+N3) during the sub-period (ts) of the period (M3) also affects the precision of the charge-coupled device.

An improved signal processing circuit 30 has been developed in order to overcome most of the drawbacks of the signal processing circuit 3 shown in FIG. 2. Referring to FIG. 3, the signal processing circuit 30 comprises a differential circuit 31, a MOS amplifier 32, an output buffer 33, a control gate 34 and a delay circuit 35. The differential circuit 31 receives the output signals (VIC, VIO) from the reference signal circuit 1 and the CCD signal circuit 2. A first one of the inputs of the amplifier 32 is connected to the output of the differential circuit 31. A second one of the inputs of the amplifier 32 and the output of the latter are connected to the control gate 34. The delay circuit 35 receives the clock input ($\phi$R) to the reset gates 13, 24 of the reference signal circuit 1 and the CCD signal circuit 2 shown in FIG. 1, and controls the control gate 34 to provide a negative feedback input to the amplifier 32 during the sub-periods (tn, to), as shown in FIG. 5C, thereby minimizing the amplification factor of noise signals present during the sub-periods (tn, to). The output of the amplifier 32 is provided to the output buffer 33.

FIG. 5B illustrates a sample output signal (Vo') which can be obtained from the signal processing circuit 30. Note that the effect of the noise signals (−N1, +N2) during the sub-period (ts) of the periods (M1, M2) is minimized. However, the signal processing circuit 30 is unable to reduce the effect of the noise signal (+N3) present during the sub-period (ts) of the period (M3). Furthermore, the switching action of the control gate 34 introduces transient noise into the output signal (Vo') of the signal processing circuit 30. This can affect the quality of the output of the charge-coupled device.

SUMMARY OF THE INVENTION

Therefore, the objective of the present invention is to provide a signal processing circuit which is capable of minimizing the presence of noise at the outputs of a charge-coupled device without the need for using a switching gate, thereby preventing the introduction of transient noise.

Accordingly, the signal processing circuit of the present invention is to be connected to the output stage of a charge-coupled device which includes a reference signal circuit and a CCD signal circuit that generate first and second output signals, respectively. The signal processing circuit comprises a differential circuit means, first and second amplifiers, and an output buffer. The differential circuit means receives the first and second output signals from the output stage of the charge-coupled device, and generates a first signal corresponding to the first output signal and a second signal corresponding to the second output signal. The first amplifier has an output, a first input which receives the first signal from the differential circuit means, and a second input which is connected to the output to serve as a negative feedback input to the first amplifier. The second amplifier has an output, a first input which receives the second signal from the differential circuit means, and a second input which is connected to the output of the first amplifier to serve as a negative feedback input to the second amplifier. The second amplifier amplifies portions of the second signal which differ from the first signal.

BRIEF DESCRIPTION OF THE DRAWINGS

Other features and advantages of the present invention will become apparent in the following detailed description of the preferred embodiment, with reference to the accompanying drawings, of which.

DETAILED DESCRIPTION OF THE PREFERRED EMBODIMENT

Figure 1A:
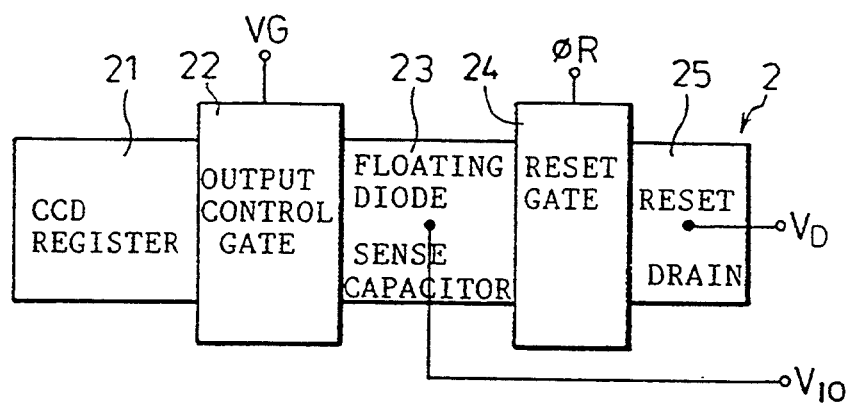
FIG. 1(a) and 1(b) are the schematic block diagram of the reference signal circuit and the CCD signal circuit found at the output stage of a conventional charge-coupled device.
Figure 1B:
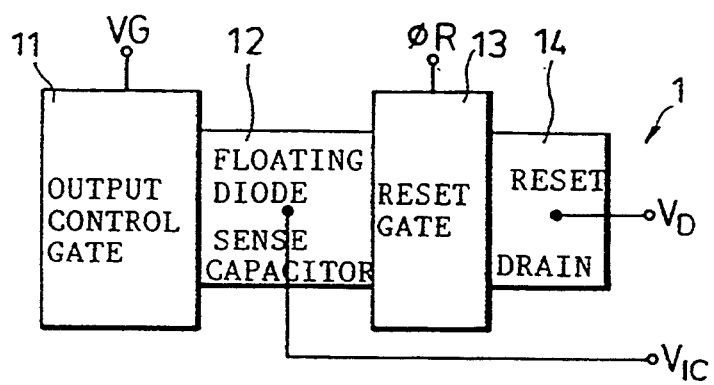
Figure 2:
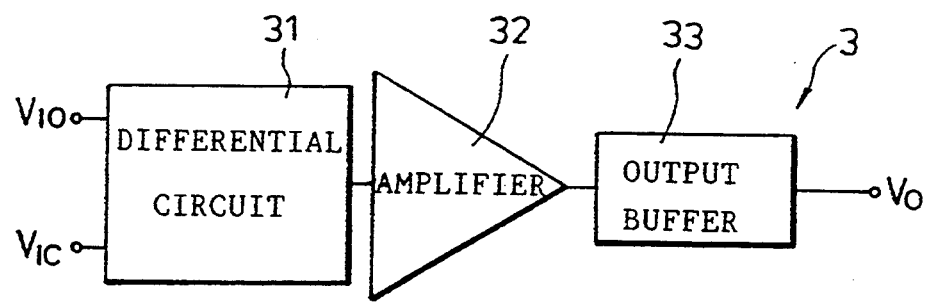
FIG. 2 is a schematic block diagram of a first conventional signal processing circuit for the output stage of a conventional charge-coupled device.
Figure 3:
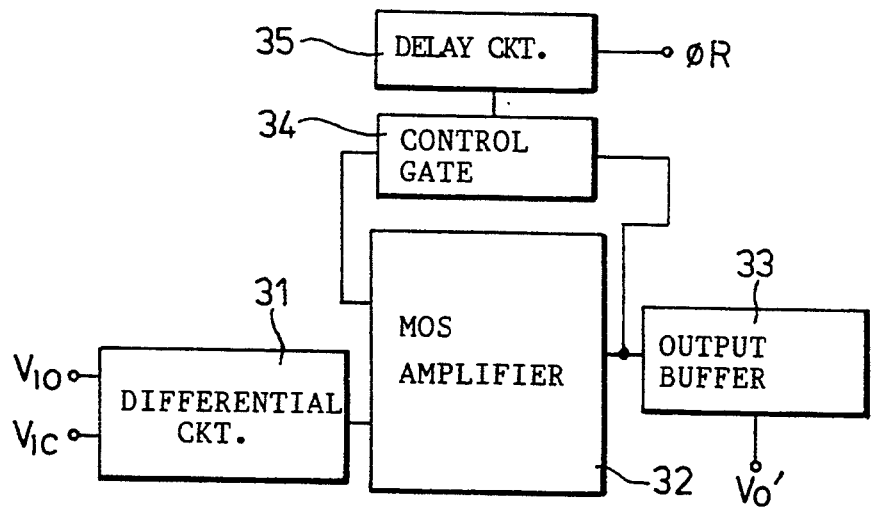
FIG. 3 is a schematic circuit block diagram of a second conventional signal processing circuit for the output stage of a conventional charge-coupled device.
Figure 4:
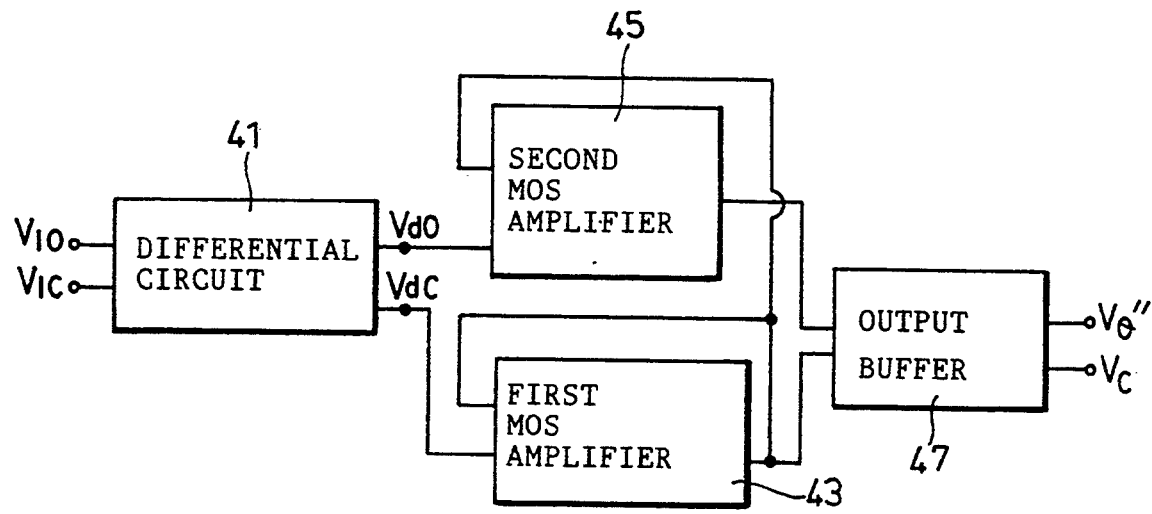
FIG. 4 is a schematic circuit diagram of the preferred embodiment of a signal processing circuit for the output stage of a conventional charge-coupled device.

Referring to FIG. 4, the preferred embodiment of a signal processing circuit according to the present invention is shown to comprise a differential circuit 41, first and second MOS amplifiers 43, 45 and an output buffer 47. The differential circuit 41 receives the output signals (VIC, VIO) from the reference signal circuit 1 and the CCD signal circuit 2 shown in FIG. 1 and generates a first signal (Vdc) corresponding to the output signal (VIC) of the reference signal circuit 1 and a second signal (Vdo) corresponding to the output signal (VIO) of the CCD signal circuit 2. The first MOS amplifier 43 has an output, a first input which receives the first signal (Vdc) from the differential circuit 41, and a second input which is connected to the output thereof to serve as a negative feedback input to the first MOS amplifier 43. The second MOS amplifier 45 has an output, a first input which receives the second signal (Vdo) from the differential circuit 41, and a second input which is connected to the output of the first MOS amplifier 43 to serve as a negative feedback input to the second MOS amplifier 45. The outputs of the first and second MOS amplifiers 43, 45 are provided to the output buffer 47.

Figure 5A:
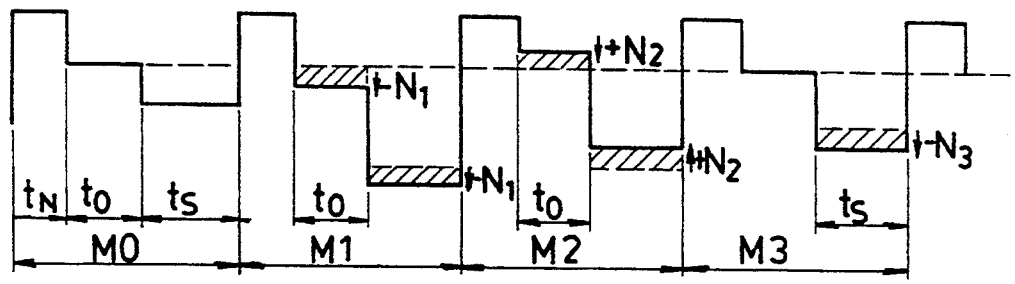
FIG. 5A illustrates a sample output signal which can be obtained from the conventional signal processing circuit shown in FIG. 2.
Figure 5B:
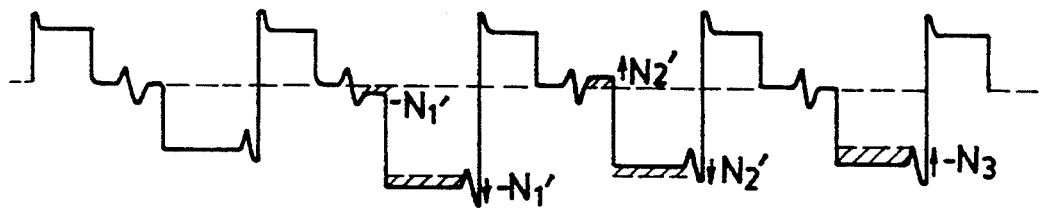
FIG. 5B illustrates a sample output signal which can be obtained from the conventional signal processing circuit shown in FIG. 3.
Figure 5C:
FIG. 5C illustrates a control output of a delay circuit of the conventional signal processing circuit shown in FIG. 3.
Figure 5D:
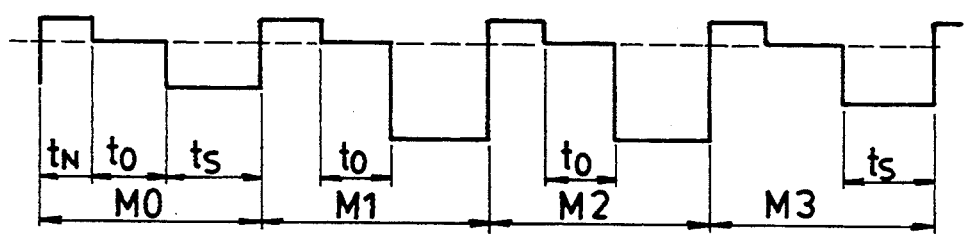
FIG. 5D illustrates a sample output signal which can be obtained from the output of the preferred embodiment of a signal processing circuit for the output stage of a charge-coupled device in accordance with the present invention.
Figure 5E:
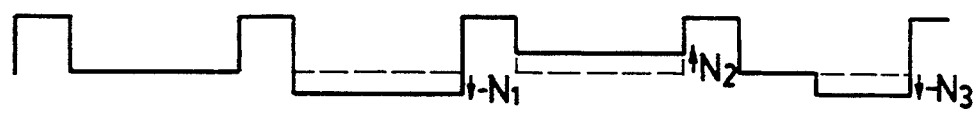
FIG. 5E illustrates a signal (Vdc) obtained from a differential circuit of the preferred embodiment.

FIG. 5E illustrates a sample first signal (Vdc) from the differential circuit 41. The second signal (Vdo) is generally similar to the first signal (Vdc) except for the presence of data signals during the sub-periods (ts).

Because the output of the first MOS amplifier 43 serves as a negative feedback input to the first and second MOS amplifiers 43, 45, the amplification of signals common to the first and second signals (Vdc, Vdo) is minimized, while portions of the second signal (Vdo) which differ from the first signal (Vdc), such as the data signals present during the sub-period (ts), are amplified by a larger factor. Therefore, the effect of the noise signals (−N1, +N2) during the sub-period (to) of the periods (M1, M2) is negligible when the present invention is in use, as shown in FIG. 5D. The signal processing circuit of the present invention can also reduce the effect of the noise signal (+N3) present in both the first and second signals (Vdc, Vdo) during the sub-period (ts), as shown in the period (M3) of FIG. 5E.

Note that the present invention can minimize effectively the presence of noise at the output stage of a charge-coupled device and does not introduce transient noise. Precision of the charge-coupled device is thus maintained when the present invention is in use.

While the present invention has been described in connection with ,what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A signal processing circuit for an output stage of a charge-coupled device, said output stage of said charge-coupled device including a reference signal circuit and a CCD signal circuit which generate first and second output signals respectively, said signal processing circuit comprising:

a differential circuit means receiving said first and second output signals from said output stage of said charge-coupled device, said differential circuit means generating a first signal corresponding to said first output signal and a second signal corresponding to said second output signal;

a first amplifier having an output, a first input which receives said first signal from said differential circuit means, and a second input which is connected to said output to serve as a negative feedback input to said first amplifier; and a second amplifier having an output, a first input which receives said second signal from said differential circuit means, and a second input which is connected to said output of said first amplifier to serve as a negative feedback input to said second amplifier, said second amplifier amplifying portions of said second signal which differ from said first signal.

2. The signal processing circuit as claimed in claim 1, further comprising an output buffer connected to said outputs of said first and second amplifiers.

3. The signal processing circuit as claimed in claim 1, wherein said first and second amplifiers are MOS amplifiers.

* * * * *